United States Patent [19]

Sunter et al.

[11] Patent Number: 4,659,948
[45] Date of Patent: Apr. 21, 1987

[54] PROGRAMMABLE LOGIC ARRAY

[75] Inventors: Stephen K. Sunter; Yachin Afek, both of Nepean, Canada

[73] Assignee: Northern Telecom Limited, Montreal, Canada

[21] Appl. No.: 514,443

[22] Filed: Jul. 18, 1983

[51] Int. Cl.[4] .............. H03K 19/096; H03K 19/173; H03K 19/20
[52] U.S. Cl. ................................. 307/469; 307/452; 364/716
[58] Field of Search .............. 307/440, 445, 448, 463, 307/450–453, 465, 468, 469, 481; 364/716; 365/103, 109

[56] References Cited

U.S. PATENT DOCUMENTS

| 3,551,693 | 12/1970 | Burns et al. | 307/452 X |
| 3,829,710 | 8/1974 | Hirasawa et al. | 307/452 |
| 3,945,000 | 3/1976 | Suzuki et al. | 307/463 X |
| 3,965,369 | 6/1976 | Hatsukano | 307/453 X |
| 3,989,955 | 11/1976 | Suzuki | 307/452 |
| 4,069,426 | 1/1978 | Hirasawa | 307/469 |
| 4,183,093 | 1/1980 | Kawagoe | 307/469 X |
| 4,277,836 | 7/1981 | Kawakami | 364/716 X |
| 4,404,654 | 9/1983 | Kamuro et al. | 365/103 |

FOREIGN PATENT DOCUMENTS

| 0081317 | 6/1983 | European Pat. Off. | 364/716 |
| 0069040 | 2/1979 | Japan | 307/452 |
| 0056732 | 4/1980 | Japan | 307/451 |
| 0197930 | 12/1982 | Japan | 307/452 |

Primary Examiner—Larry N. Anagnos
Attorney, Agent, or Firm—Schwartz, Jeffery, Schwaab, Mack, Blumenthal & Evans

[57] ABSTRACT

A single plane programmable logic array (PLA) using dynamic CMOS logic has switching transistors located at specific locations within a row-column matrix. The transistors within a column are series connected and have their gates common connected in rows. PMOS and NMOS control transistors conduct exclusively to connect output and input ends of the columns respectively to logic 1 or logic 0 in successive phases of a common clock. Control inputs are applied to specific rows. By applying data inputs to column input ends and interconnecting all the column output ends, the PLA is configured to function as a multiplexer. By setting the input end of columns to logic 0 and selectively interconnecting output ends of the columns, the PLA is configured to perform other combinational logic functions.

3 Claims, 5 Drawing Figures

PROGRAMMABLE LOGIC ARRAY

BACKGROUND OF THE INVENTION

This invention relates to a single plane, programmable logic array (PLA) using dynamic CMOS logic and more particularly to the implementation of such a PLA as a multiplexer.

The PLA has emerged as an important building block in many VLSI circuit designs, particularly in microprocessors and digital signal processors. The highly regular structure of PLAs greatly simplifies the automated design and layout of complex logic circuits and permits a large reduction in the silicon area required for a given function. Typically PLAs decrease design complexity and silicon area but degrade power and speed performance relative to custom logic.

A standard PLA consists of two matrices: the AND plane and the OR plane. In each matrix, according to the presence or absence of switching transistors at matrix cross-points, a certain combination of inputs on a set of row (or column) lines gives a certain combination of outputs respectively on the column (or row) lines. The outputs of the AND plane are called products and the outputs of the OR plane are called sums. According to Boolean algebra, any logic equation can be reduced to the sum of products. Therefore a single PLA can be used to implement any combinational logic equation by having the outputs of the AND plane form the inputs to the OR plane. "Combinational" means that the output is a function of a combination of present inputs and is not dependent on previous inputs or outputs, i.e. the PLA has no memory.

Essentially there are two ways of implementing the core of a logic plane: logic inputs are connected to the gates of Transistors and the transistors are connected either in series (NAND) or in parallel (NOR). The "series" version requires less area but the "parallel" version is faster. Usually the same structure is used in both planes of the PLA to maximize speed or density. The two versions are equivalent since two NOR planes are equivalent to an AND plane followed by an OR plane when the inputs and outputs are inverted.

The PLA structure may be dynamic or static in operation. Since power density is an important consideration in VLSI totally dynamic PLAs are attractive. Dynamic operation permits a denser logic array since minimum transistor sizes can be used throughout. The resulting smaller gate capacitances further improve the power reduction achieved by eliminating pull-up transistors characteristic of static PLAs. This approach is particularly suited to NMOS technology. Unfortunately the use of two or more possibly non-overlapping clock phases decreases the maximum frequency of operation and increases circuit complexity.

Co-pending U.S. Pat. application No. 440,870, now abandoned, describes a simple high speed PLA structure implemented in a standard CMOS process. The basic structure used in each plane of the PLA is a NOR gate. The PLA described in that patent specification is highly regular and thus simplifies automated design and layout of complex logic circuits and, in addition, provides savings in silicon area. Frequently the activated part of the OR plane, i.e. the number of transistors at matrix cross-points as a percentage of the total number of cross-points is quite low. In such a case the area of silicon is not used to its highest efficiency.

The PLA area can be reduced by dispensing altogether with the OR plane and having the AND plane perform the OR plane functions. This renders the AND plane slightly more complex, but especially if the required combinational logic capabilities of the PLA are somewhat limited, the overall saving in silicon area is well worthwhile.

SUMMARY OF THE INVENTION

According to one aspect of the invention, there is provided a single plane, PLA having a matrix of column lines and row lines, a plurality of switching transistors selectively interconnecting row lines to column lines at matrix cross-points according to a programmed selection, the switching transistors being series connected in columns and having their gates common connected in rows, the transistors operable on detecting a particular combination of input logic states on the rows connected thereto to produce a corresponding combination of logic states at outputs of the columns, at least two columns at their output ends being electrically interconnected whereby an output of the PLA is the logical OR of said at least two column outputs.

To configure the PLA to perform the comprehensive combinational logic capability of conventional two plane PLAs, (i) the output ends of predetermined columns are electrically interconnected to provide the logical OR sums of combinations of the column outputs and (ii) the column input ends are connected to logic 0. In addition, if it is desired to have more than one logical OR output derived from the same column, the switching transistors in that column can be duplicated in another column of the single plane PLA.

To configure the PLA to perform as a multiplexer, (i) the output ends of predetermined columns are electrically interconnected to provide the logical OR sum of combinations of the column outputs and (ii) the column input ends are connected to a plurality of data inputs.

The output ends of the columns can be connected together in pairs, triplets or n-tuples depending on the multiplexing scheme required.

The PLA is preferably implemented in CMOS logic. The PLA can have a PMOS control transistor associated with the output end of respective columns to connect the column to logic 1 when the control transistor is conducting. The PLA can also include an NMOS control transistor associated with the input end of respective columns to connect the columns to logic 0 or a data input when the control transistors are conducting. The PMOS and NMOS transistors can be driven by a common clock to ensure exclusive operation of the PMOS and NMOS transistor so as to minimize power requirements of the PLA.

The outputs may be buffered with CMOS inverters for driving following circuits.

BRIEF DESCRIPTION OF THE DRAWINGS

An embodiment of the invention will now be described by way of example with reference to the accompanying drawings in which:-

DETAILED DESCRIPTION OF THE PREFERRED EMBODIMENTS

Figure 1:
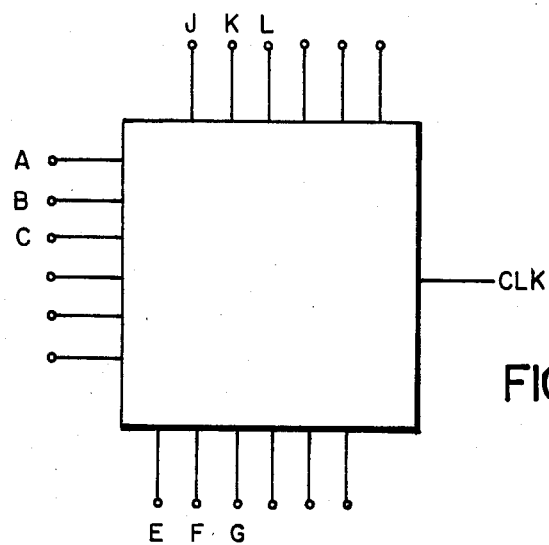
FIG. 1 is a block schematic diagram of a PLA according to the invention.

Referring in detail to the drawings, FIG. 1 shows a single plane PLA having a first set of inputs A, B, C . . ., a second set of inputs E, F, G . . . , a clock input CLK and a set of outputs J, K, L, . . . .

Figure 2:
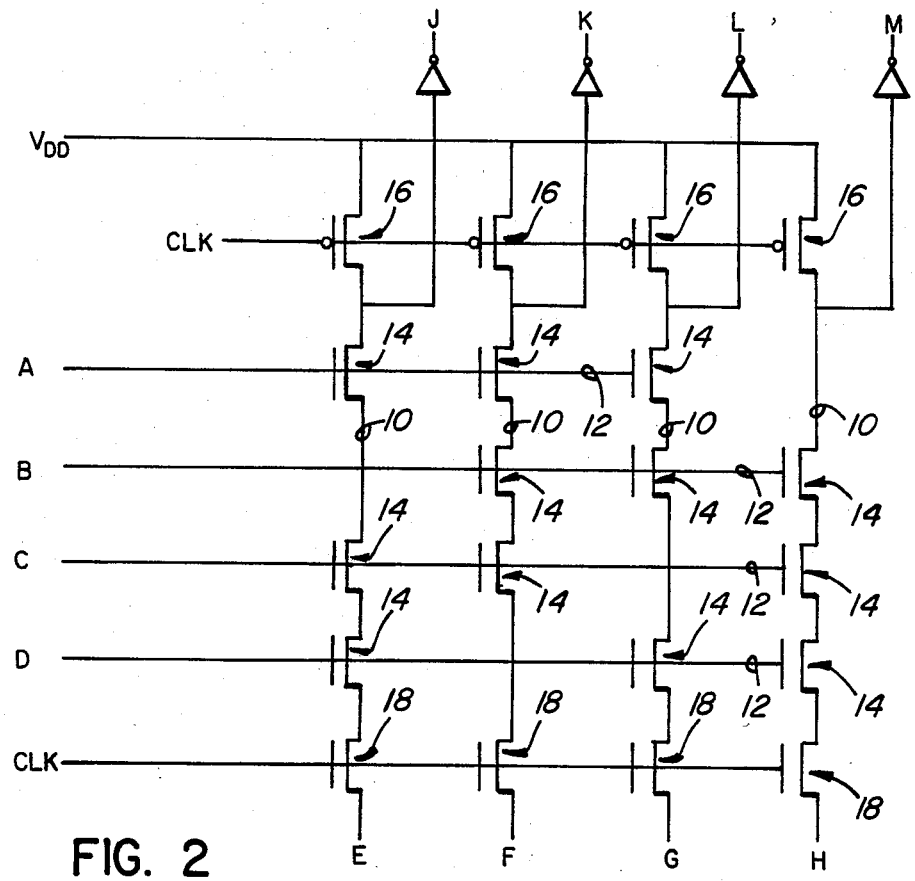
FIG. 2 is a circuit diagram showing the PLA of FIG. 1.

As shown in FIG. 2 the PLA has column lines 10, and row lines 12 defining a four by four matrix. According to a desired logic function, NMOS switching transistors 14 are located at specific matrix cross-points, the switching transistors being series connected in columns and having their gates common connected in rows.

Each column line is connected at its top end to a source of reference potential $V_{DD}$ when a series connected PMOS control transistor 16 is conducting or is connected to an input E, F, G or H when a series connected NMOS control transistor 18 is conducting. The NAND gates represented by the columns of switching transistors 14 are selectively switched on by logic state changes on inputs A, B, C, and D. The gates of the control transistors 16 and 18 are connected to a common source of timing pulses CLK. A negative clock pulse leading edge at time $t_1$ switches on the PMOS transistors 16 while blocking the NMOS transistors 18 to prevent current flowing directly from $V_{DD}$ to ground. Column outputs J, K, L and M are consequently low. At time $t_2$, a rising edge of the clock signal blocks the PMOS transitors 16 and switches on the NMOS transistors 18. If the combination of inputs A, B, C and D is such as to switch on all of the switching transistors 14 in a particular column then a path from the input terminal of that column to the output terminal is established and the column output J, K, L or M goes high.

Figure 3:
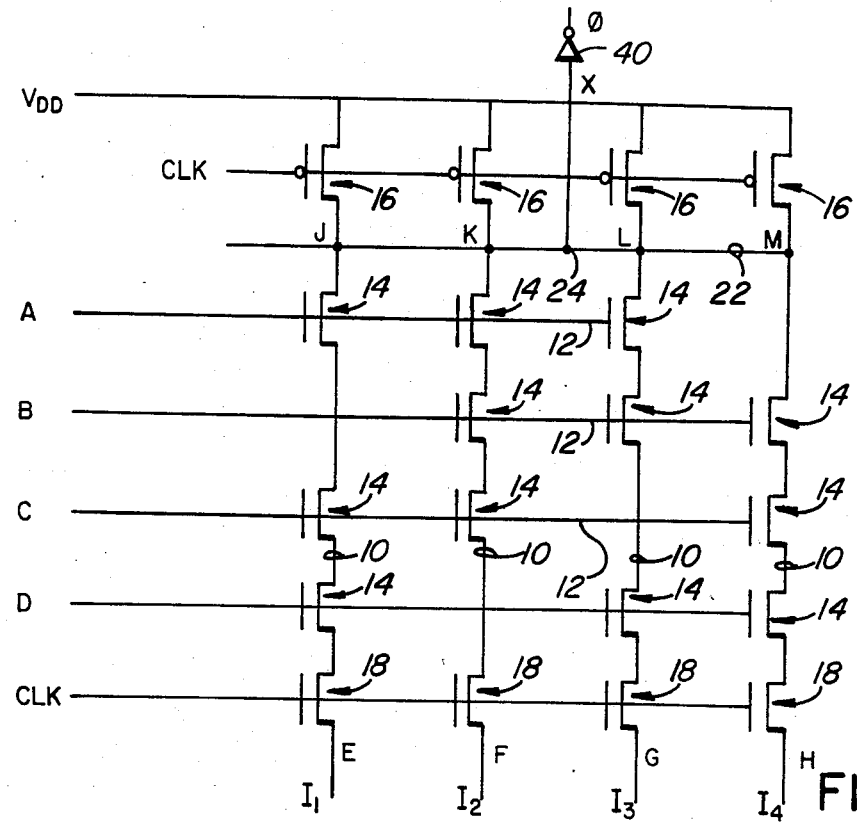
FIG. 3 is a circuit diagram showing the FIG. 2 PLA configured as a multiplexer.

The general logic equation of the FIG. 2 PLA is:

$J = A \cdot C \cdot D \cdot \overline{E}$ $K = A \cdot B \cdot C \cdot \overline{F}$ $L = A \cdot B \cdot D \cdot \overline{G}$ $M = B \cdot C \cdot D \cdot \overline{H}$ Referring to FIG. 3, the PLA illustrated is configured as a four line to one line multiplexer. The output ends of the column lines are interconnected by line 22. Also digital data streams $I_1, I_2, I_3$ and $I_4$ are applied to inputs E, F, G, and H. By an appropriate combination of the control inputs A, B, C, D, any one of the data inputs can be selected. The OR sum of all the column outputs J, K, L and M appears at terminal 24 and is inverted at inverter 40 to give multiplexed output ∅.

Figure 4:
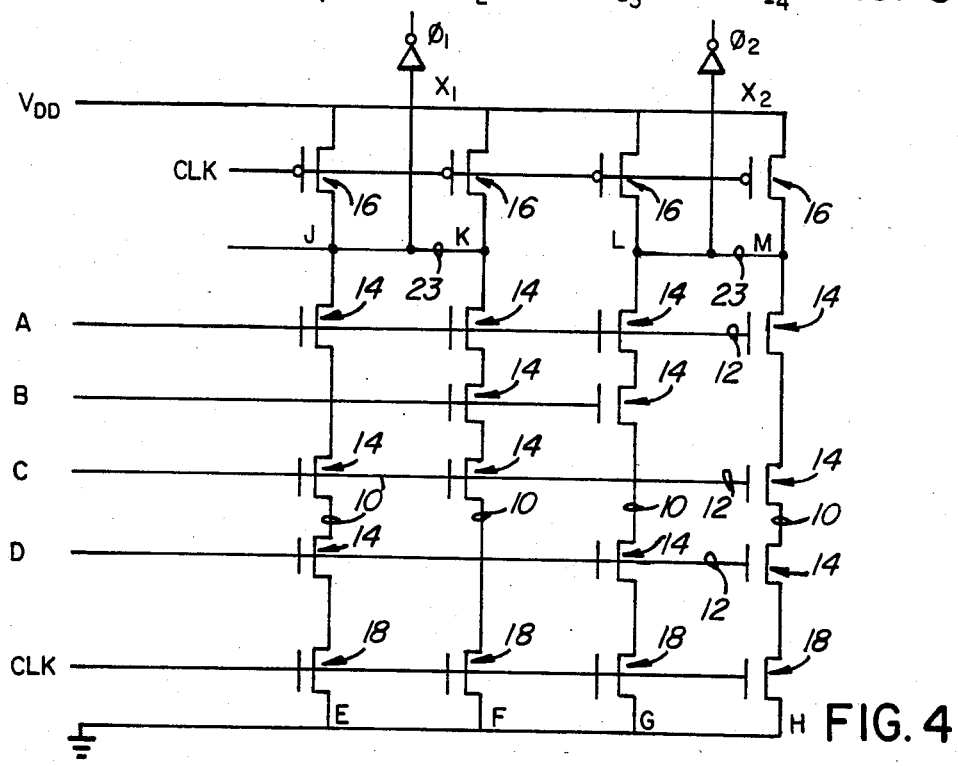
FIG. 4 is a circuit diagram showing the FIG. 2 PLA configured to perform a specific combinational logic function.

For the example of FIG. 3 the equation relating the output to the inputs is;

$\emptyset = X = A \cdot C \cdot D \cdot \overline{data} \ I_1 + A \cdot B \cdot C \cdot \overline{data} \ I_2 + A \cdot B \cdot D \cdot \overline{data} \ I_3 + B \cdot C \cdot D \cdot \overline{data} \ I_4$ In an alternative application of this single plane PLA shown in FIG. 4, all the inputs E, F, G and H are connected to ground and only a preselected combination of column outputs J, K, L and M are interconnected by lines 23. Also in contrast with the FIG. 3 embodiment, the column combination of switching transistors having an output J is duplicated in the column having output M. The PLA has two outputs $\emptyset_1$ and $\emptyset_2$. The PLA with inverters is thus an AND plane with each column output equal to the logical AND of the control inputs A, B, C and D connected to that particular column. Connecting lines 23 provide for two outputs from the PLA. These outputs when inverted are equal to the logical OR of these columns.

The equation relating the outputs to the inputs is:

$\emptyset_1 = A \cdot C \cdot D + A \cdot B \cdot C$ $\emptyset_2 = A \cdot B \cdot D + A \cdot C \cdot D$ Thus by appropriate placement of transistors in each column in addition to selective wiring together of outputs, a complete AND/OR function is defined. The single plane adaptation of the conventional two plane AND/OR PLA is only efficient however, if switching transistors 14 are only sparsely distributed within the OR plane since the duty of the OR plane is, in the single plane PLA, performed by selective column interconnections represented by the lines 23 together with some duplication of the column switching transistor combinations.

A large array with many outputs such as outputs X, $X_1$, or $X_2$ each of which may be connected to an inverter may be generated simply by placing single plane arrays similar to that shown in FIGS. 2 and 3 side-by-side.

Figure 5:
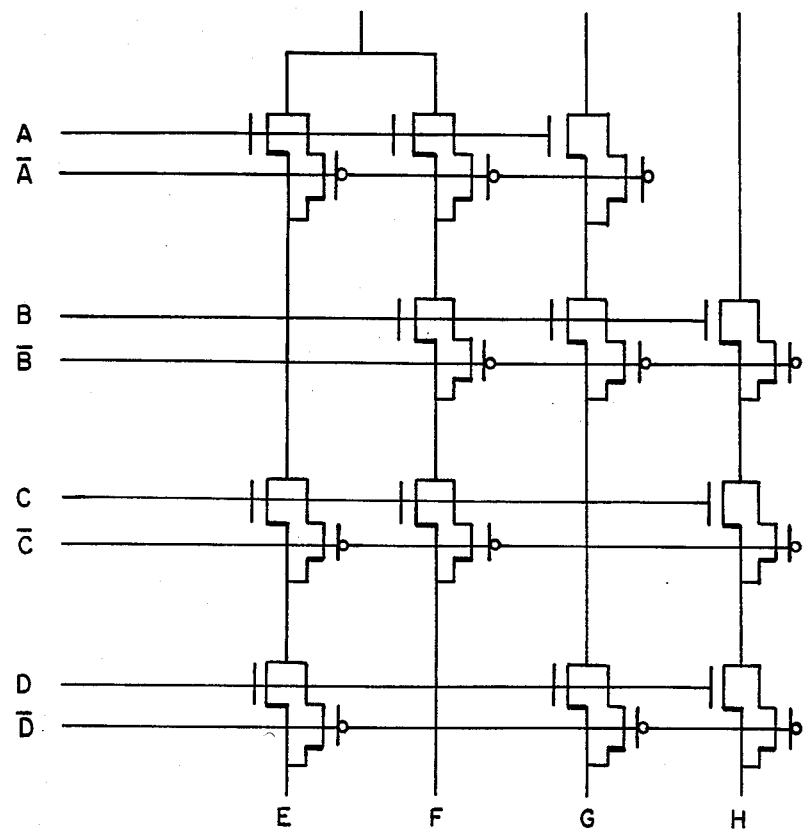
FIG. 5 shows a part of the FIG. 2 PLA but in which the NMOS switching transistors are replaced by NMOS-PMOS transistor pairs.

In an alternative embodiment shown in FIG. 5, the PLA is programmed by placing NMOS-PMOS transistor pairs at the matrix cross-points. This array is faster than that described in FIGS. 2 and 3 but requires about four times as much chip area for implementation. The PLA requires no clock and permits input data to propagate to the output as long as it is selected.

What is claimed is:

1. A single plane programmable logic array (PLA) having a reference potential rail, a first series of logic input terminals, a second series of logic input terminals, and a regular row-column array of switching FET structures, the PLA being programmable to render the switching FET structures operable as switching FETs at selected positions of the row-column matrix, the resulting switching FETs being source-to-drain series connected in individual array columns and having their gates common connected in rows, each column having a respective PMOS control FET at a first end with a source terminal thereof connected to said reference potential rail, respective input logic terminals of said first series being commonly connected to the gates of a respective row of switching FETs, each column having a respective NMOS control FET at a second end, the NMOS control FETs having source terminals connected to respective input logic terminals of said second series, the programmed PLA having an output end having column outputs, each dependent on logic states at the first and second series of logic input terminals and on the presence of switching FETs at the selected positions in the column, and wherein at the first end of each column, a drain-drain connection exists between the PMOS control FET and the adjacent switching FET, said programming being such as to produce at the column outputs of the array at least one conducting lead joining at least two of said drain-drain connections whereby the logical OR of the column outputs of joined columns is available.

2. A PLA as claimed in claim 1 wherein the PLA has a plurality of said conducting leads, the combination of row matrix positions occupied by switching FETs in a first column thereof is duplicated within a second column, and the drain-drain connections of the first and second columns being individual column output ends connected to individual column conducting leads.

3. A PLA as claimed in claim 1 in which the outputs from the interconnected as well as from the individual column output ends are taken through respective inverters.

* * * * *